(12) United States Patent
Liang et al.

(10) Patent No.: US 8,860,140 B2
(45) Date of Patent: Oct. 14, 2014

(54) TUNNELING FIELD EFFECT TRANSISTOR AND METHOD FOR FORMING THE SAME

(75) Inventors: Renrong Liang, Beijing (CN); Ning Cui, Beijing (CN); Jing Wang, Beijing (CN); Jun Xu, Beijing (CN)

(73) Assignee: Tsinghua University (CH)

( * ) Notice: Subject to any disclaimer, the term of this patent is extended or adjusted under 35 U.S.C. 154(b) by 106 days.

(21) Appl. No.: 13/147,470

(22) PCT Filed: Jun. 24, 2011

(86) PCT No.: PCT/CN2011/076340
§ 371 (c)(1),
(2), (4) Date: Aug. 2, 2011

(87) PCT Pub. No.: WO2012/116528
PCT Pub. Date: Sep. 7, 2012

(65) Prior Publication Data
US 2012/0223390 A1   Sep. 6, 2012

(30) Foreign Application Priority Data
Mar. 1, 2011   (CN) .......................... 2011 1 0049788

(51) Int. Cl.
| H01L 29/78 | (2006.01) |
| H01L 29/66 | (2006.01) |
| H01L 29/49 | (2006.01) |
| H01L 29/739 | (2006.01) |

(52) U.S. Cl.
CPC ...... *H01L 29/7391* (2013.01); *H01L 29/66356* (2013.01); *H01L 29/4983* (2013.01); *H01L 29/4908* (2013.01)
USPC ........... 257/366; 438/176; 438/592; 438/596; 438/283; 257/E21.623; 257/E21.624; 257/E21.421; 216/46

(58) Field of Classification Search
CPC ............ H01L 29/4808; H01L 29/4983; H01L 29/66356; H01L 29/7391
USPC ........... 257/366, E21.421, E21.623, E21.624, 257/E21.625, E21.626; 438/157, 176, 283, 438/592, 596; 216/46
See application file for complete search history.

(56) References Cited

U.S. PATENT DOCUMENTS 5,824,584 A * 10/1998 Chen et al. .................... 438/267
6,248,629 B1 * 6/2001 Liu et al. ....................... 438/258

(Continued)

FOREIGN PATENT DOCUMENTS

| CN | 1192053 A | 9/1998 |
| CN | 1938858 A | 3/2007 |
| CN | 101523607 A | 9/2009 |

OTHER PUBLICATIONS

Saurabh et al., "Novel Attributes of a Dual Material Gate Nanoscale Tunnel Field-Effect Transistor", Feb. 2011, IEEE Transactions on Electron Devices, vol. 58, No. 2, pp. 404-410.*

(Continued)

*Primary Examiner* — Kimberly Rizkallah
*Assistant Examiner* — Maria Ligai
(74) *Attorney, Agent, or Firm* — Lerner, David, Littenberg, Krumholz & Mentlik, LLP

(57) ABSTRACT

The present disclosure provides a TFET, which comprises: a substrate; a channel region formed in the substrate, and a source region and a drain region formed on two sides of the channel region; a gate stack formed on the channel region, wherein the gate stack comprises: a gate dielectric layer, and at least a first gate electrode and a second gate electrode distributed in a direction from the source region to the drain region and formed on the gate dielectric layer, and the first gate electrode and the second gate electrode have different work functions; and a first side wall and a second side wall formed on a side of the first gate electrode and on a side of the second gate electrode respectively.

13 Claims, 10 Drawing Sheets

(56) References Cited

U.S. PATENT DOCUMENTS

| | | | |
|---|---|---|---|
| 7,582,517 B2* | 9/2009 | Xiao et al. | 438/176 |
| 2003/0178689 A1* | 9/2003 | Maszara et al. | 257/407 |
| 2010/0038713 A1* | 2/2010 | Majhi et al. | 257/344 |
| 2010/0295058 A1 | 11/2010 | Cho | |

OTHER PUBLICATIONS

International Search Report for Application No. PCT/CN2011/076340 dated Dec. 8, 2011.

* cited by examiner

TUNNELING FIELD EFFECT TRANSISTOR AND METHOD FOR FORMING THE SAME

CROSS REFERENCE TO RELATED APPLICATIONS

The present application is a national phase entry under 35 USC §371 of International Application No. PCT/CN2011/076340, filed Jun. 24, 2011, which claims the benefit of and priority to Chinese Patent Application No. 201110049788.1, filed Mar. 1, 2011, the entire disclosures of which are incorporated herein by reference.

FIELD

The present disclosure relates to a semiconductor device fabrication and design field, and more particularly to a tunneling field effect transistor and a method for forming the same.

BACKGROUND

In the past few decades, in order to achieve higher chip densities, faster work speeds and lower power consumption, a feature size of a conventional metal-oxide-semiconductor field effect transistor (MOSFET) has continuously been scaling down, and currently it is entering into a nanoscale regime. However, a resultant severe challenge is a short channel effect, such as a threshold voltage roll-off (Vt roll-off), a drain induced barrier lowering (DIBL) or a source and drain punch-through, which cause significant increase of the off-state leakage current and thus deteriorate device performance.

Currently, various improvements and structures have been introduced to minimize a negative influence of the short channel effects, among which a tunneling field effect transistor (TFET) is a promising candidate. Since when the MOSFET device is in a sub-threshold state, i.e., the device is operating in weak inversion, and at this situation thermionic emission is a major transport mechanism, thus a sub-threshold slope of the MOSFET device at room temperature is limited to 60 mV/dec. Compared with the conventional MOSFETs, since an active region of the TFET device is essentially a tunneling junction, the TFET has a weaker or no short channel effect; moreover, a major current transport mechanism of the TFET is a band-to-band tunneling, a drain current in a sub-threshold region increase exponentially with an applied gate-source voltage, and therefore the TFET has a lower sub-threshold slope and the drain current is almost not influenced by operating temperature.

A fabricating process of the TFET is compatible with that of a conventional complementary metal-oxide-semiconductor field effect transistor (CMOSFET). A structure of the TFET is based on a MOS-gated p-i-n diode. A typical conventional n-type TFET is shown in FIG. 1. Specifically, the n-type TFET comprises a source region 1000' with p-type doping and a drain region 2000' with n-type doping, a channel region 3000' separates the source region 1000' and the drain region 2000', and a gate stack 4000' comprises a gate dielectric layer and a gate electrode, which are disposed above the channel region 3000'.

When the TFET device is in an off-state, i.e., when no gate voltage is applied, a junction formed between the source region 1000' and the drain region 2000' is a reverse biased diode. Since a potential barrier established by the reverse biased diode is larger than that established by the CMOSFET, even when a channel length is very short, the direct tunneling current and the sub-threshold leakage current of the TFET device decrease greatly. When a voltage is applied to the gate terminal of the TFET, an electron conducting path is generated in the channel region 3000' by the field effect. Once an electron density in the channel becomes degenerated, a tunneling junction is formed between the source region 1000' and the channel region 3000'. Then the tunneling current flows through this tunneling junction. From a viewpoint of the energy band, a tunnel length of a p-n junction formed between the source region 1000' and the channel region 3000' is mainly adjusted by controlling the gate voltage for the TFET device based on a MOS-gated p-i-n diode. With a geometric dimension of the TFET shrinking down, in order to obtain a higher ratio of on-state current to off-state current ($I_{on}/I_{off}$) and a lower sub-threshold slope, typical methods used are: improving a steepness of a impurity doping concentration at an interface of the p-n junction formed between the source region and the channel region; introducing a narrow energy band gap material as the source region so that a heterostructure is formed between the source region and the channel region. For example, silicon is used for the channel while germanium (Ge) or InAs etc. is employed for the source region. However, these methods greatly increase difficulty and cost of the fabrication process. The introduction of the narrow energy band gap materials inevitably results in a sharp increase of the off-state current as well.

SUMMARY

The present disclosure is aimed to solve at least one of the above mentioned technical problems.

According to an aspect of the present disclosure, a tunneling field effect transistor is provided, which comprises: a substrate; a channel region formed in the substrate; a source region and a drain region formed on two sides of the channel region, wherein the drain region is of a first doping type and the source region is of a second doping type, and the first doping type and the second doping type are opposite; a gate stack formed on the channel region, wherein the gate stack comprises: a gate dielectric layer, and at least a first gate electrode and a second gate electrode distributed in a direction from the source region to the drain region and formed on the gate dielectric layer, and the first gate electrode and the second gate electrode have different work functions; and a first side wall and a second side wall formed on a side of the first gate electrode and on a side of the second gate electrode respectively.

In one embodiment, the channel region is of the first doping type, the second doping type or is intrinsic and the channel region connects the source region and the drain region.

In one embodiment, the tunneling field effect transistor is a n-type TFET, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

In one embodiment, the tunneling field effect transistor is a p-type TFET, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

According to an aspect of the present disclosure, a method for forming a tunneling field effect transistor is provided, which comprises steps of providing a substrate; forming a gate dielectric material layer on the substrate; forming a first gate electrode and a second gate electrode on the gate dielectric material layer and the first gate electrode and the second gate electrode have different work functions; forming a first side wall and a second side wall on the gate dielectric material layer, and on a side of the first gate electrode and on a side of the second gate electrode; implanting respectively a first doping impurity and a second doping impurity into the substrate to form a source region and a drain region, and defining an area between the source region and the drain region as a channel region, wherein the drain region is of a first doping type and the source region is of a second doping type and the first doping type and the second doping type are opposite; and removing all the gate dielectric material layer except that under the first side wall, the second side wall, the first gate electrode and the second gate electrode, to form a gate dielectric layer.

In one embodiment, the channel region is of the first doping type, the second doping type or is intrinsic and the channel region connects the source region and the drain region.

In one embodiment, the tunneling field effect transistor is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

In one embodiment, the tunneling field effect transistor is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

In one embodiment, the method further comprises: forming a first contact layer and a second contact layer in the source region and the drain region respectively; and forming the first interlayer dielectric layer and the second interlayer dielectric layer on the first contact layer and the second contact layer respectively.

In one embodiment, forming a first gate electrode and a second gate electrode on the gate dielectric material layer further comprises: forming the second gate electrode on the gate dielectric material layer; conformally depositing a first gate electrode material layer on the second gate electrode and on part of the gate dielectric material layer; etching anisotropically the first gate electrode material layer to form two first gate electrodes, each on a side of the second gate electrode; and removing one of the two first gate electrodes.

In one embodiment, forming a first gate electrode and a second gate electrode on the gate dielectric material layer further comprises: forming the second gate electrode on the gate dielectric material layer; forming a mask layer on a first part of the second gate electrode and a first part of the gate dielectric material layer; conformally depositing a first gate electrode material layer on a second part of the second gate electrode, on a second part of the gate dielectric material layer and on the mask layer; etching anisotropically the first gate electrode material layer to form the first gate electrode on a side of the second gate electrode; and removing the mask layer and all the first gate electrode material layer except the first gate electrode.

In one embodiment, the method further comprises introducing reactive ions in the second gate electrode to adjust the second work function.

In one embodiment, the reactive ions are provided by ion implantation, plasma treatment or annealing.

According to an aspect of the present disclosure, a tunneling field effect transistor structure is provided, which comprises: a n-type TFET with a hetero-material gate work function; and a p-type TFET with a hetero-material gate work function, wherein the n-type TFET and the p-type TFET are fabricated by the method according to any one of the above methods.

The embodiments of the present disclosure have the following advantages.

1. Since the TFET has the lateral hetero-material work function, the energy band profile in the channel region may be modulated, which not only significantly reduces a sub-threshold slope of the transistor significantly by using an energy band engineering technique, but also increases a drive current greatly.

2. The first gate electrode or the second gate electrode may be of various metals or alloys, doped polycrystalline silicon or doped polycrystalline silicon germanium, so that the lateral hetero-material work function may be precisely adjusted by controlling parameters such as ratio of the alloy, type and concentration of doped impurities and germanium mole fraction. The fabrication techniques of the gate electrodes described above have a wide process window, and are easy to be implemented.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

Figure 1:
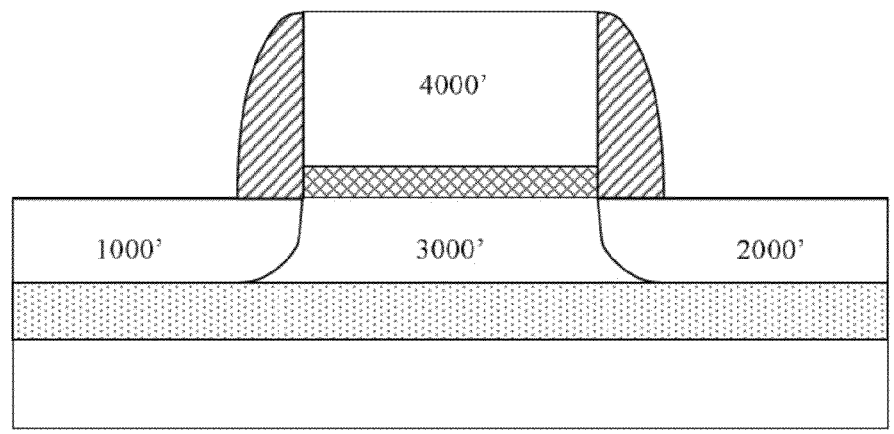
FIG. 1 is a typical conventional n-type TFET.

DETAILED DESCRIPTION OF EMBODIMENTS
OF THE DISCLOSURE

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

With the geometric dimension of the TFET shrinking down, in order to obtain a higher ratio of on-state current to off-state current ($I_{on}/I_{off}$) and a lower sub-threshold slope, a lateral distribution of the gate work function in the source region to drain region direction is constant for conventional TFET device, which is not favorable for further optimization of device performance. Therefore, according to an embodiment of the present disclosure, a first gate electrode and a second gate electrode with different work functions respectively are adopted, so that the energy band profile in the channel region may be modulated, which not only significantly reduces the sub-threshold slope of the transistor by using an energy band engineering technique, but also greatly increases the drive current.

Figure 2:
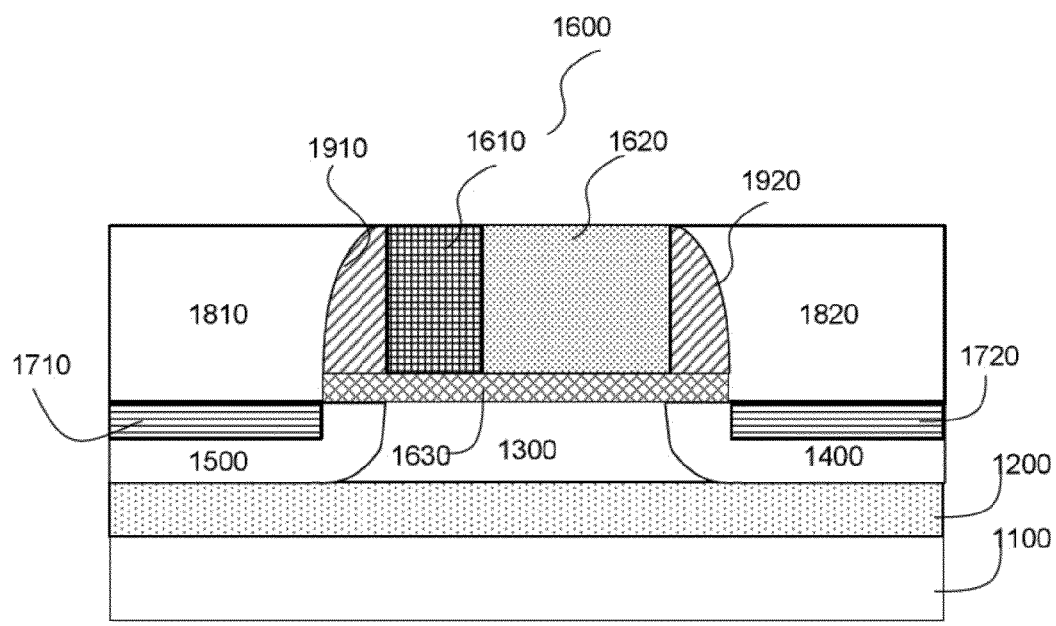
FIG. 2 is a cross-sectional view of a TFET having a hetero-material gate work function according to an embodiment of the present disclosure.

FIG. 2 is a cross-sectional view of a TFET having a heteromaterial gate work function according to an embodiment of the present disclosure. The TFET comprises a substrate 1100. In one embodiment, a buffer layer (insulation layer) 1200 may be formed on the substrate 1100. The substrate 1100 may be a single-crystal silicon wafer or silicon on insulator (SOI) wafer substrate, which may further reduce the substrate leakage current of the transistor. Or, the substrate 1100 may be of other types, such as a single-crystal germanium substrate, a single-crystal silicon germanium substrate, a polycrystalline silicon substrate, a polycrystalline silicon germanium substrate, a carbon nanotube substrate, a graphene substrate, a GaAs substrate, an InAs substrate, an InSb substrate, a GaSb substrate and so on. In the embodiment, the substrate 1100 may be doped to have a n-type resistivity for fabricating a n-type TFET; while the substrate 1100 may be doped to have a p-type resistivity for fabricating a p-type TFET. In the embodiment, when fabricating the n-type TFET, phosphorus atoms or arsenic atoms may be doped into the single-crystal silicon substrate to have a doping concentration within $10^{13}$-$10^{18}$ cm$^{-3}$; when fabricating the p-type TFET, boron atoms may be doped into the single-crystal silicon substrate to have a doping concentration within $10^{13}$-$10^{18}$ cm$^{-3}$. In fact, the TFET does not have a specific restriction on doping type of the substrate as the conventional MOSFET does, since the MOSFET relies on the inversion of channel charge due to the field effect, while the TFET is based on band-to-band tunneling of MOS-gated inverse biased p-i-n junction. For the p-i-n junction, the "i" layer may be a lightly doping layer or an intrinsic layer.

As shown in FIG. 2, the TFET may further comprise a channel region 1300, a source region 1500 and a drain region 1400. The source region 1500 and the drain region 1400 are formed on two sides of the channel region 1300 respectively. The drain region 1400 is of a first type doping and the source region 1500 is of a second type doping, and the doping types are opposite. For example, in one embodiment, the drain region 1400 is of the n-type doping, the source region is of the p-type doping and the channel region 1300 is of the n-type doping, the p-type doping or intrinsic. However, the doping concentration of the channel region 1300 is lower than that of the drain region 1400 or the source region 1500. The TFET further comprises a gate dielectric layer 1630 formed on the channel region 1300, and a first gate electrode 1610 and a second gate electrode 1620, whereas the first gate electrode 1610 and the second gate electrode 1620 are distributed from the source region 1500 to the drain region 1400 and formed on the first gate dielectric layer 1630. The first gate electrode 1610 and the second gate electrode 1620 have different work functions. The TFET further comprises a first side wall 1910 and a second side wall 1920 formed on the gate dielectric layer 1630 and on two sides of the first gate electrode 1610 and the second gate electrode 1620 respectively.

In one embodiment, the first type doping may be the n-type doping and the second type doping may be the p-type doping, which means the TFET is the n-type TFET. In another embodiment, the first type doping may be the p-type doping and the second type doping may be the n-type doping, which means the TFET is the p-type TFET.

In one embodiment, the first gate electrode 1610 is located at a side near the source region 1500 and has a first work function; the second gate electrode 1620 is located at a side near the drain region 1400 and has a second work function. The first work function is smaller than the second work function. In another embodiment, the first work function is larger than the second work function.

In one embodiment, the TFET further comprises a first contact layer 1710 and a second contact layer 1720 formed on the source region 1500 and the drain region 1400 respectively, and a first interlayer dielectric (ILD) layer 1810 and a second interlayer dielectric (ILD) layer 1820 formed on the first contact layer 1710 and the second contact layer 1720 respectively.

FIGS. 3-12 are cross-sectional views of a TFET showing a process of a method for forming a TFET having a heteromaterial gate work function according to an embodiment of the present disclosure. The method comprises the following steps.

Step S101, a substrate 1100 is provided. In the embodiment, the substrate 1100 may be a single-crystal silicon substrate or a wafer substrate on an insulation layer, which may further reduce a substrate leakage current of the transistor. Or, the substrate 1100 may be of other types, such as a single-crystal germanium substrate, a single-crystal silicon germanium substrate, a polycrystalline silicon substrate, a polycrystalline silicon germanium substrate, a carbon nanotube substrate, a graphene substrate, a GaAs substrate, an InAs substrate, an InSb substrate, a GaSb substrate. In the embodiment, the substrate 1100 may be doped to have a n-type resistivity before fabricating a n-type TFET; the substrate 1100 may be doped to have a p-type resistivity before fabricating a p-type TFET. In the embodiment, when fabricating the n-type TFET, phosphorus atoms or arsenic atoms may be doped into the single-crystal silicon substrate to have a doping concentration within a range of $10^{13}$-$10^{18}$ cm$^{-3}$; when fabricating the p-type TFET, boron atoms may be doped into the single-crystal silicon substrate to have a doping concentration within $10^{13}$-$10^{18}$ cm$^{-3}$. In fact, the TFET does not have a specific restriction on doping type of the substrate as the conventional MOSFET does, since the MOSFET relies on an inversion of channel charge due to the field effect while a principle of the TFET is based on band-to-band tunneling of MOS-gated inverse biased p-i-n junction. For the p-i-n junction, the "i" layer may be a lightly doping layer or an intrinsic layer. In one embodiment, an insulating layer 1200 is formed on the silicon substrate 1100, and a semiconductor layer 8000 is formed on the insulating layer 1200. The semiconductor layer 8000 may be of materials such as Si, SiGe or Ge. Similarly, in one embodiment, the substrate 1100 may be a SOI or a GOI substrate comprising the above layers.

Step S102, a gate dielectric material layer 2000 is formed on the semiconductor layer 8000. The gate dielectric material layer 2000 is preferably a high-k gate dielectric material layer and may be SiO$_2$ or SiON and etc.

Figure 3:
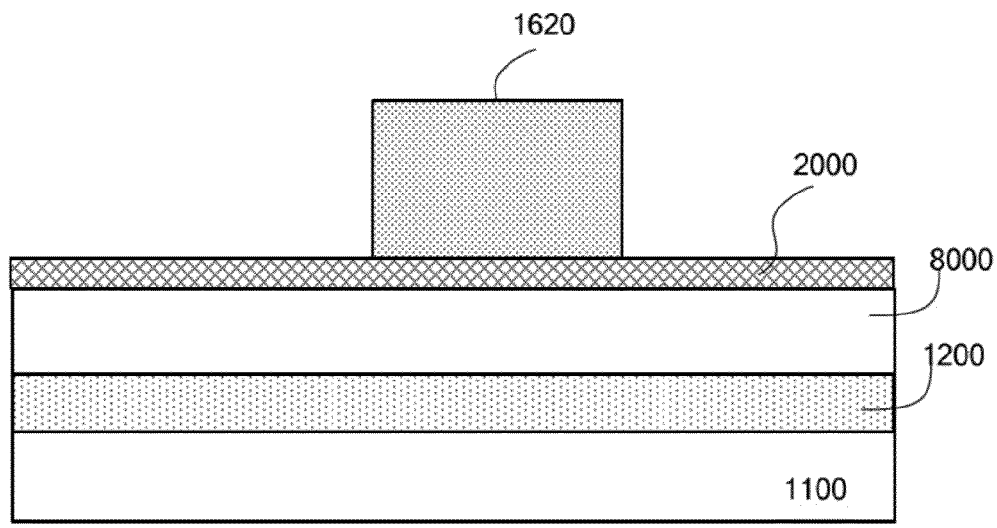
FIGS. 3-12 are cross-sectional views of a TFET showing a process of a method for forming a TFET having a hetero-material gate work function according to an embodiment of the present disclosure.

Step S103, the second gate electrode 1620 is formed on the gate dielectric material layer 2000, as shown in FIG. 3.

Figure 4:
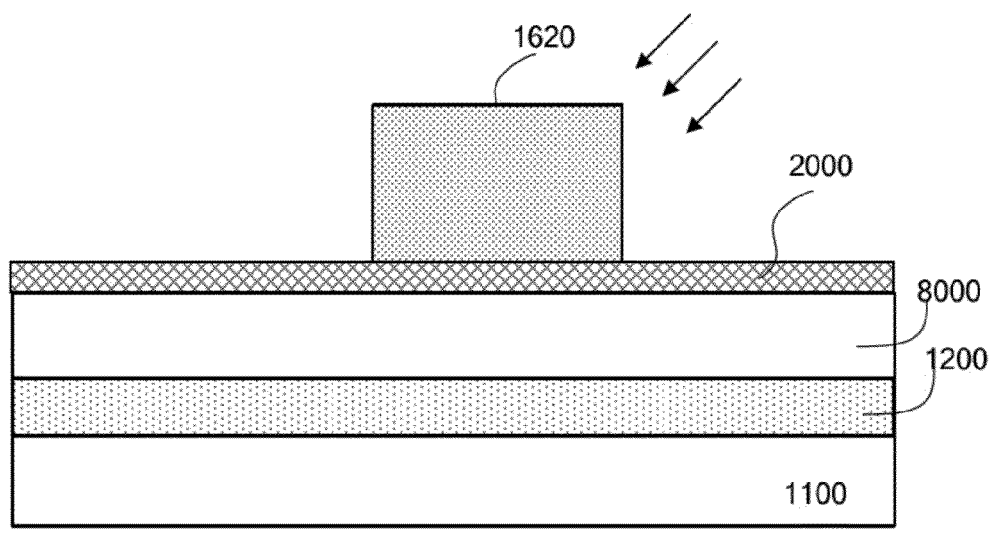

Step S104, in the embodiment, the work function of the second gate electrode 1620 may be changed by introducing reactive icons into the second gate electrode 1620, as shown in FIG. 4. For example, the reactive ions may be provided by plasma treatment, ion implantation, remote plasma treatment and chemical process etc. In another embodiment, the reactive ions react with the second gate conductive film to increase or reduce the work function of the second gate electrode 1620; when the second gate electrode 1620 is of metal, reactive ions such as but not limited to Er, Y, Pt, N, O, Cl, F may be adopted to change the work function of the second gate electrode 1620; when the second gate electrode 1620 is of the polycrystalline silicon or the polycrystalline silicon germanium, the n-type or p-type ions such as but not limited to B, Ph, As may be used as the reactive ions to change the work function of the second gate electrode 1620.

Figure 5:
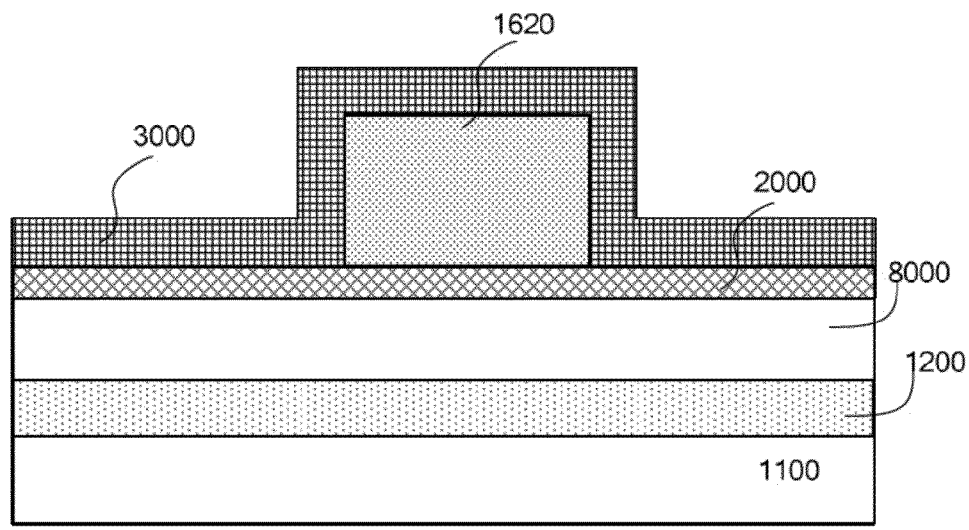

Step S105, a first gate electrode material layer 3000 is conformally deposited on a surface of the second gate electrode 1620 and on part of the gate dielectric material layer 2000, as shown in FIG. 5.

Figure 6:
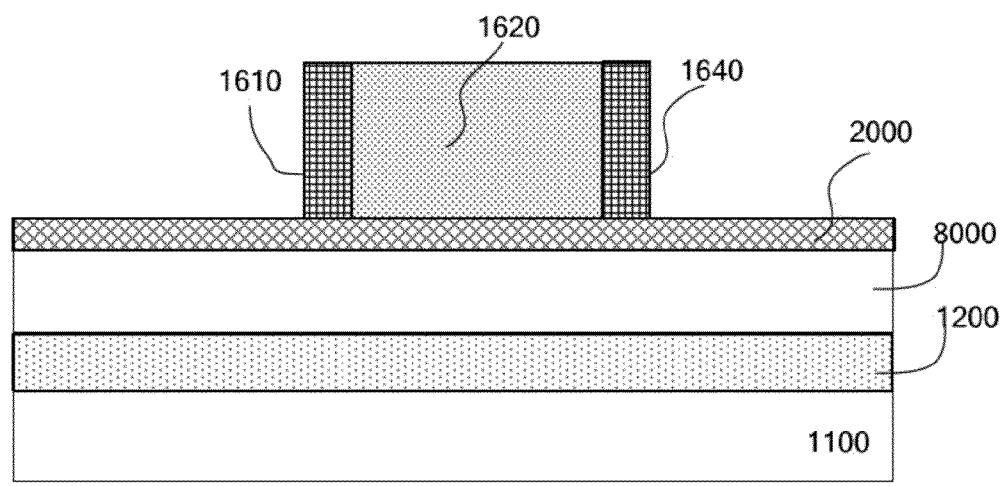

Step S106, the first gate electrode material layer 3000 is etched anisotropically so as to form the two first gate electrodes 1610 and 1640 on two sides of the second gate electrode 1620 to respectively, as shown in FIG. 6.

Figure 7:
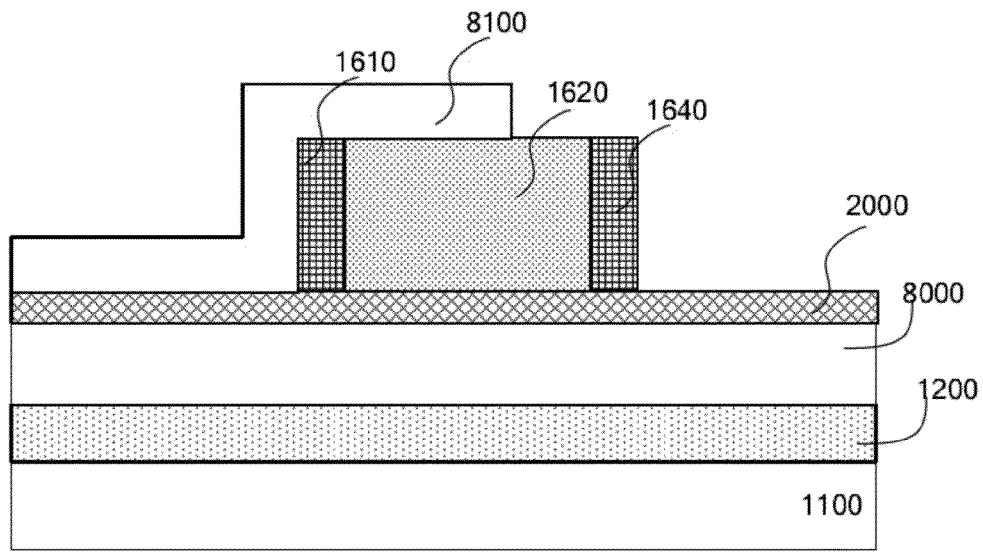
Figure 8:
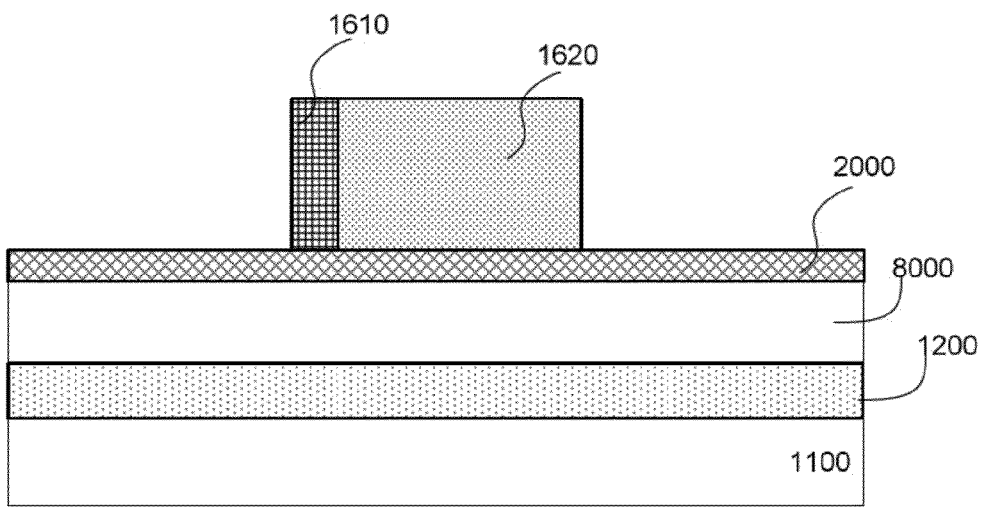

Step S107, the first gate electrodes 1640 on one side of the second gate electrode 1620 is removed, as shown in FIGS. 7 and 8. For example, the first gate electrode 1610 is covered with a mask layer such as photoresist or SiN, and a part of the second gate electrode layer 1620 may also be covered by the mask layer, as shown in FIG. 7. Then the first gate electrodes 1640 located on the one side of the second gate electrode 1620 is removed by using asymmetric etching techniques, as shown in FIG. 8.

Figure 9:
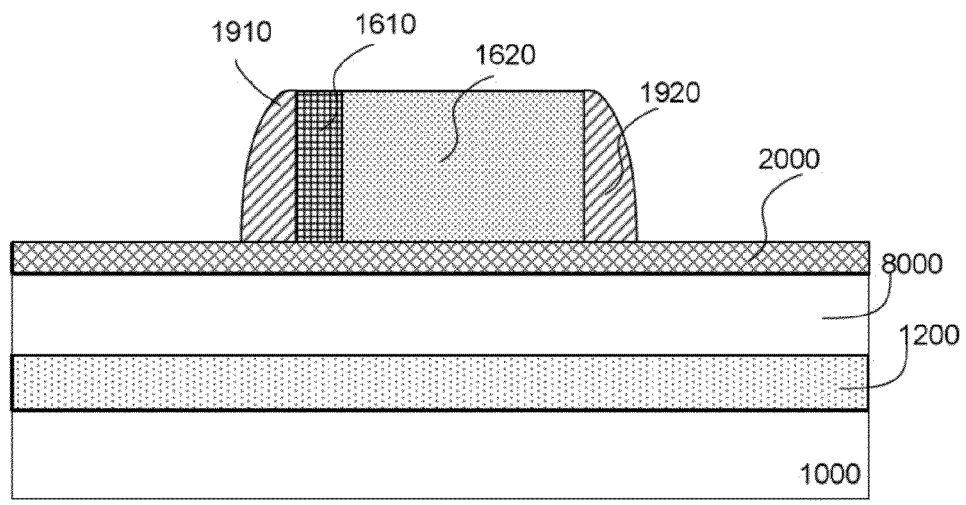

Step S108, the first side wall 1910 and the second side wall 1920 are formed on the gate dielectric material layer 2000 and on a side of the first gate electrode 1610 and on a side of the second gate electrode 1620 respectively, as shown in FIG. 9. The side walls may be of insulating dielectrics such as Si$_3$N$_4$, SiO$_2$ or SiON. A method for forming the side walls may comprise steps of: conformally depositing dielectric materials on a top surface and sides of the first gate electrode 1610 and the second gate electrode 1620; anisotropically etching back by using plasma etching and/or wet etching, so that only the dielectric materials on the sides of the first gate electrode 1610 and the second gate electrode 1620 are remained while other parts are removed, which means side walls of the first gate electrode 1610 and the second gate electrode 1620 are formed. A height of the side walls in a vertical direction is approximately equal to that of the first gate electrode 1610 and the second gate electrode 1620; and a width of the side walls in a lateral direction is substantially equal to a thickness of the deposited dielectric material. After the first side wall 1910 and the second side wall 1920 are formed, shallow trench isolation may be formed by lithography together with recess etching techniques so as to achieve an isolation space between transistors.

Step S109, a first doping impurity and a second doping impurity are implanted into the semiconductor layer 8000 to form the drain region 1400 and the source region 1500 respectively, and the area between the drain region 1400 and the source region 1500 is defined as the channel region 1300. The channel region 1300 is connecting the source region 1500 and the drain region 1400. The drain region 1400 is of a first doping type and the source region 1500 is of a second doping type.

In the embodiment, the TFET and the conventional MOSFET devices have significant differences when forming the source region 1500 and the drain region 1400. For the MOSFET, when forming the n-type device, both the source region 1500 and the drain region 1400 have n-type resistivity; when forming the p-type device, both the source region 1500 and the drain region 1400 have p-type resistivity. However, for the TFET, when forming the n-type device, the source region 1500 has p-type resistivity while the drain region 1400 has n-type resistivity, and when the TFET works, the source region 1500 is grounded and a positive voltage is applied to the gate and the drain region 1400; when forming the p-type device, the source region 1500 has n-type resistivity while the drain region 1400 has p-type resistivity, and when the TFET works, the source region 1400 is grounded and a negative voltage is applied to the gate and the drain region 1400.

Figure 10:
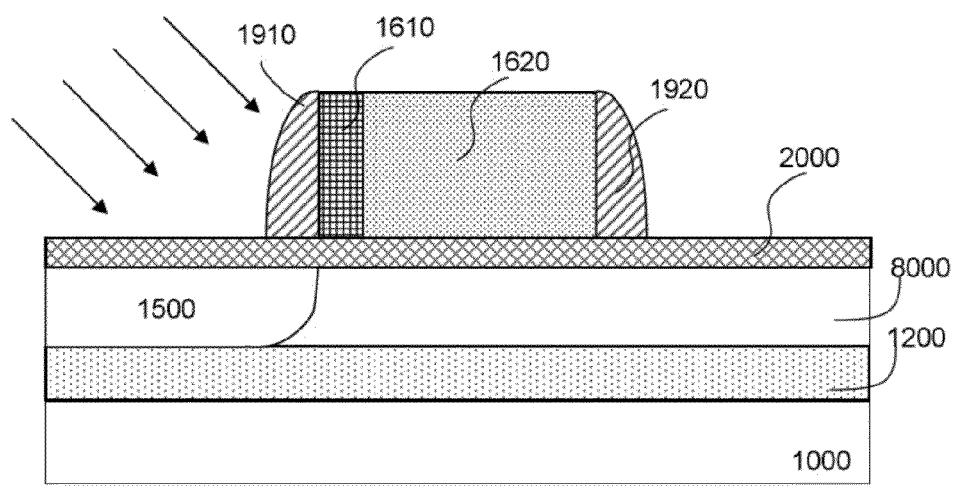
Figure 11:
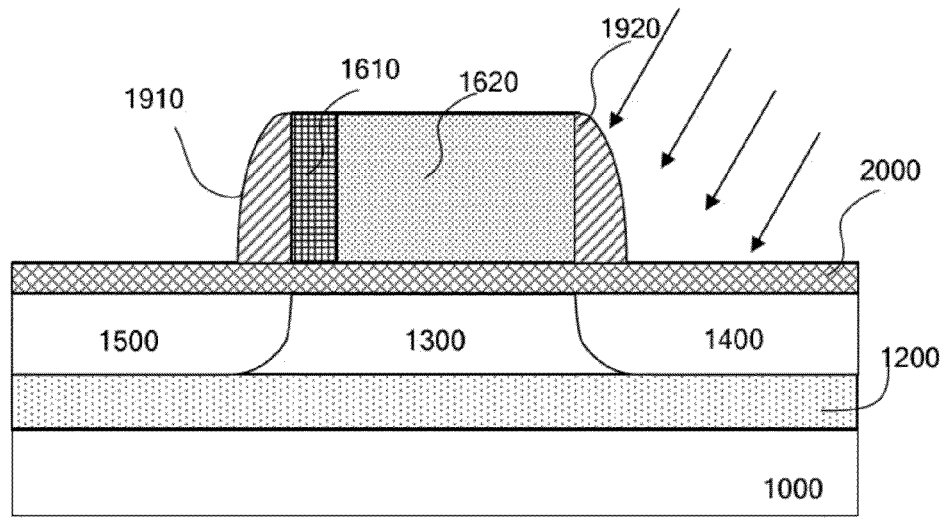

Therefore, in the embodiment, in order to form asymmetric doping types, the impurity ions need to be implanted at a certain angle twice. As shown in FIG. 10, the impurity ions are implanted into the semiconductor layer 8000 at a first angle for the first time in a direction indicated by the arrow in the figure; the doping type is p and the p-type heavily doped region (source region 1500) is formed and the doping concentration may be within a range of $10^{18}$-$10^{21}$ cm$^{-3}$. As shown in FIG. 11, the impurity ions are implanted into the semiconductor layer 8000 at a second angle for the second time in a direction indicated by the arrow in the figure; the doping type is n and the n-type heavily doped region (drain region 1400) is formed and the doping concentration may be within a range of $10^{18}$-$10^{21}$ cm$^{-3}$. In the embodiment, the first angle and the second angle may be the same or may be different, which depends on the lateral distribution of the impurity concentration when designing the TFET. After the ions are implanted, the doped impurity atoms are activated. Specifically, known activation annealing technologies may be used, such as rapid thermal processing, spike annealing and laser annealing, so that the doped impurity atoms may be activated and a heavily doped source region and a drain region are formed. It should be noted that for the TFET, the steeper the impurity concentration distribution of the p-n junction formed between the source region and the channel region and between the channel region and the drain region is, the better the performance of the TFET will be. Therefore, more severe requirements are put forward on a thermal budget of the impurity activation technology and a subsequent fabrication process, so as to reduce as much as possible the re-diffusion of the doped impurity atoms in the source region and the drain region.

Figure 12:
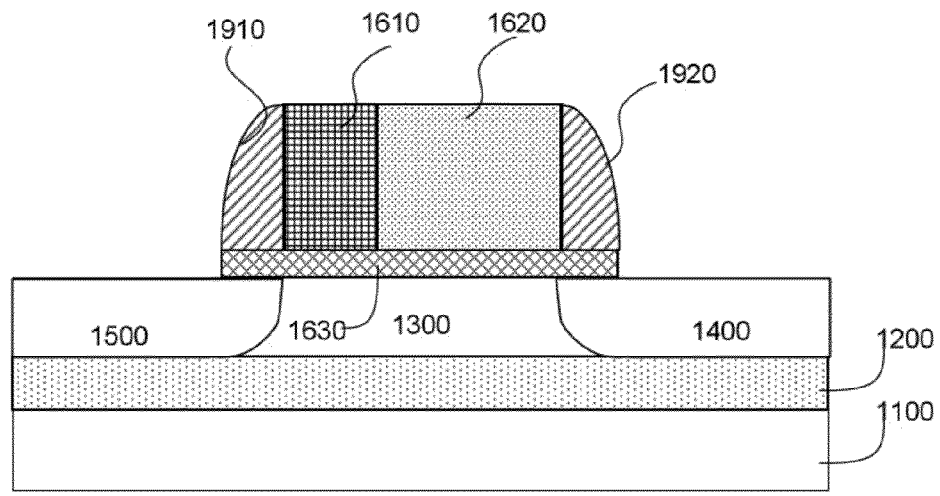
Figure 13:
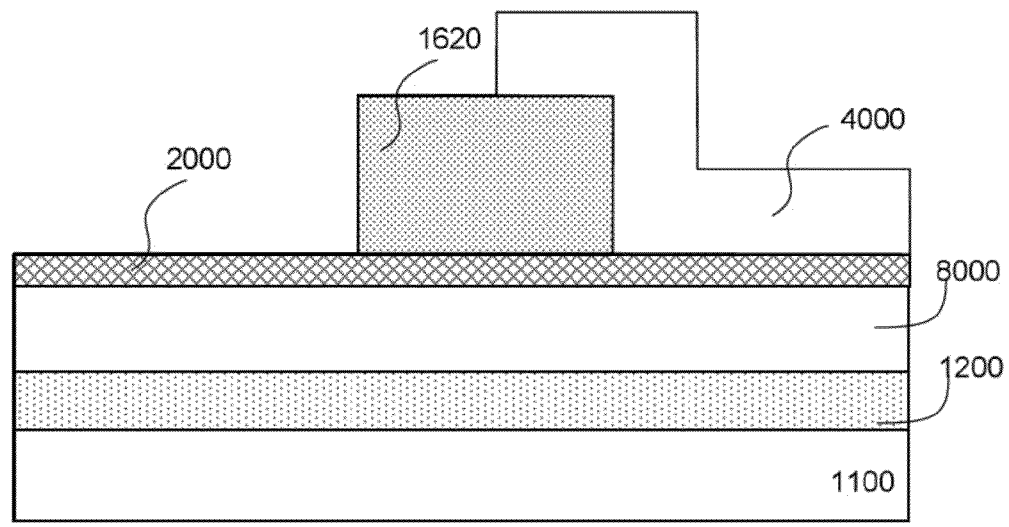
FIGS. 13-16 are cross-sectional views of a TFET showing a process of a method for forming a first gate electrode and a second gate electrode according to an embodiment of the present disclosure.

Step S110, the gate dielectric material layer 2000 is removed except the parts under the first side wall 1910, the second side wall 1920, the first gate electrode 1610 and the second gate electrode 1620, so as to form the gate dielectric layer 1630, as shown in FIG. 12.

Step S111, the first contact layer 1710 and the second contact layer 1720 are formed in the source region 1500 and the drain region 1400 respectively, and the first interlayer dielectric (ILD) layer 1810 and the second interlayer dielectric (ILD) layer 1820 are formed on the first contact layer 1710 and the second contact layer 1720 respectively, as shown in FIG. 2.

In other embodiments of the present disclosure, the first gate electrode 1610 and the second gate electrode 1620 may be formed with other steps. FIGS. 13-16 are cross-sectional views of a TFET showing a process of a method for forming a first gate electrode and a second gate electrode according to an embodiment of the present disclosure.

Step S201, the second gate electrode 1620 is formed on the gate dielectric material layer 2000.

Step S202, a mask layer 4000 is formed on a first part of the second gate electrode 1620 and on a first part of the gate dielectric material layer 2000. The mask layer may be of materials such as photoresist or $SiO_2$, as shown in FIG. 14.

Figure 14:
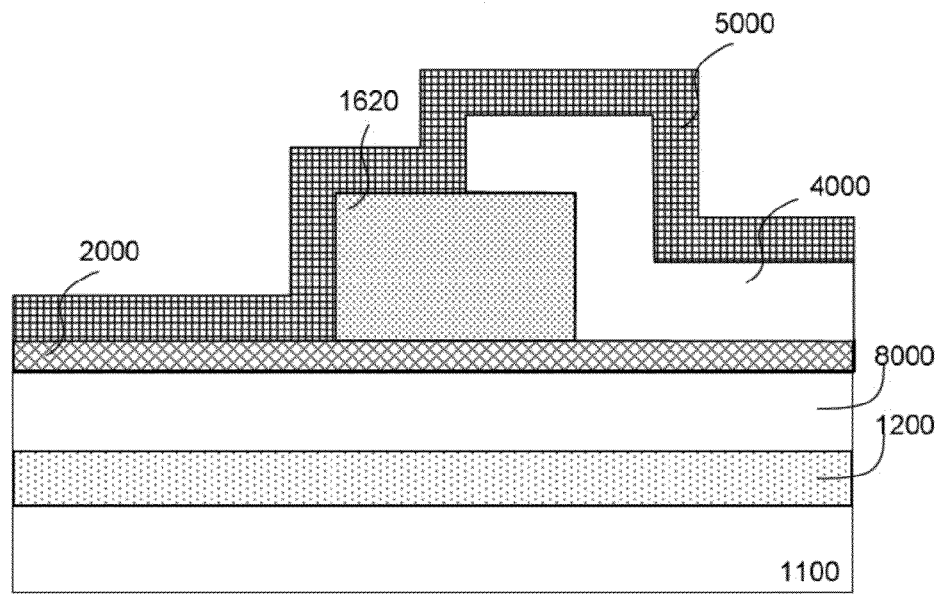

Step S203, a first gate electrode material layer 5000 is deposited on a second part of the second gate electrode 1620, on a second part of the gate dielectric material layer 2000 and on the mask layer 4000, as shown in FIG. 14.

Figure 15:
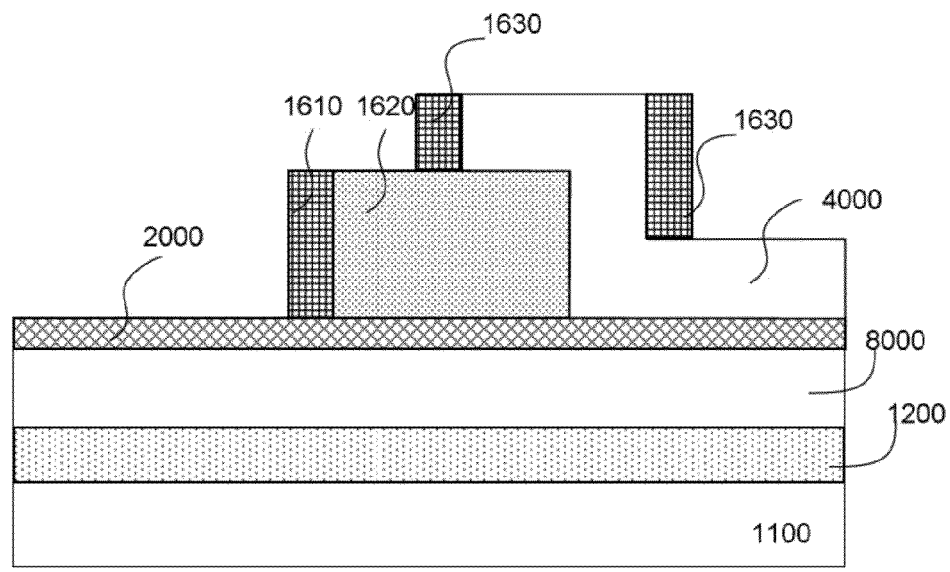

Step S204, the first gate electrode material layer 5000 is etched anisotropically so as to form the first gate electrode 1610 on the side of the second gate electrode 1620 and to form two first gate electrode material layers 1630 on two sides of the mask layer 4000, as shown in FIG. 15.

Figure 16:
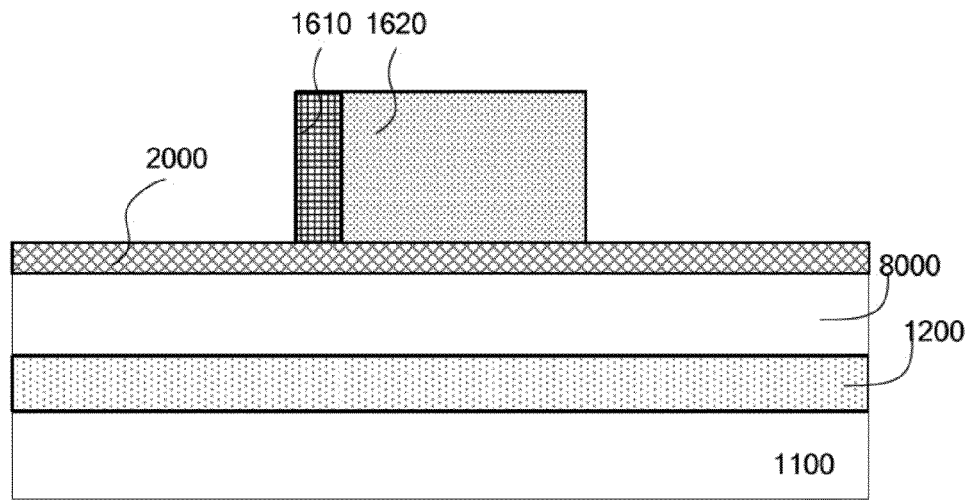

Step S205, the mask layer 4000 is removed, all the first gate electrode material layer 5000, or the two first gate electrode material layers 1630 except the first gate electrode 1610 are removed, which means the first gate electrode material layers on the two sides of the mask layer 4000 are removed, as shown in FIG. 16.

Figure 17:
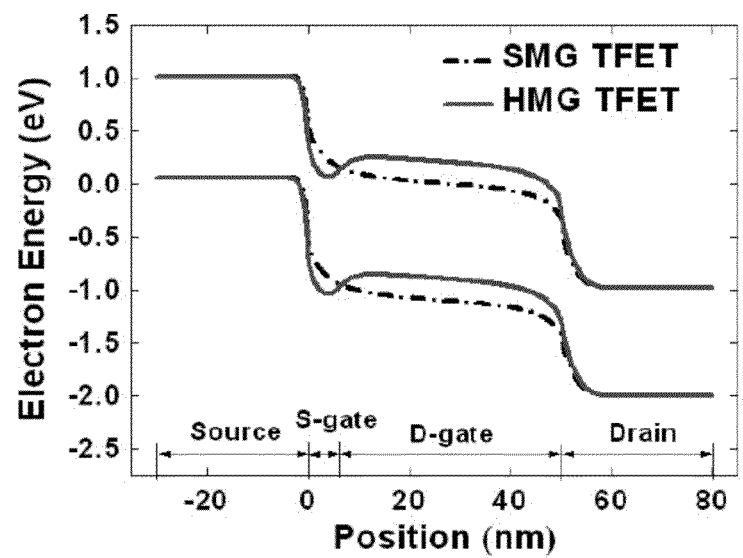
FIGS. 17-19 are schematic diagrams showing simulation results of the TFET according to embodiments of the present disclosure.
Figure 18:
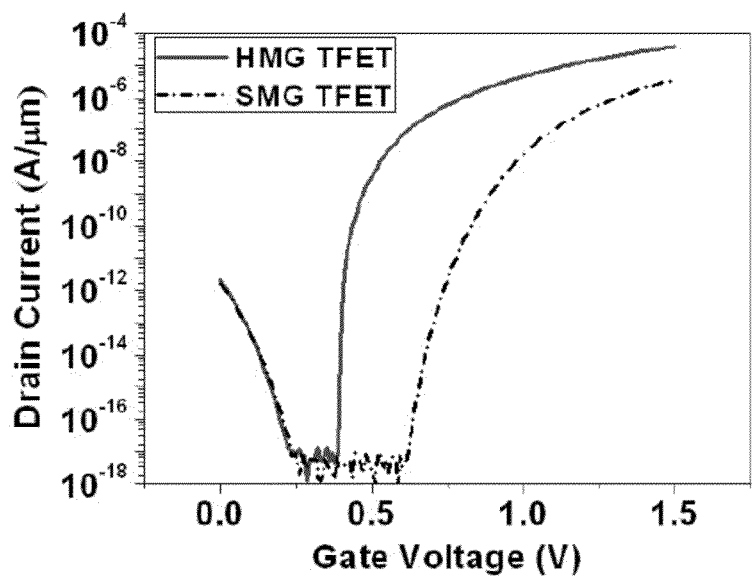
Figure 19:
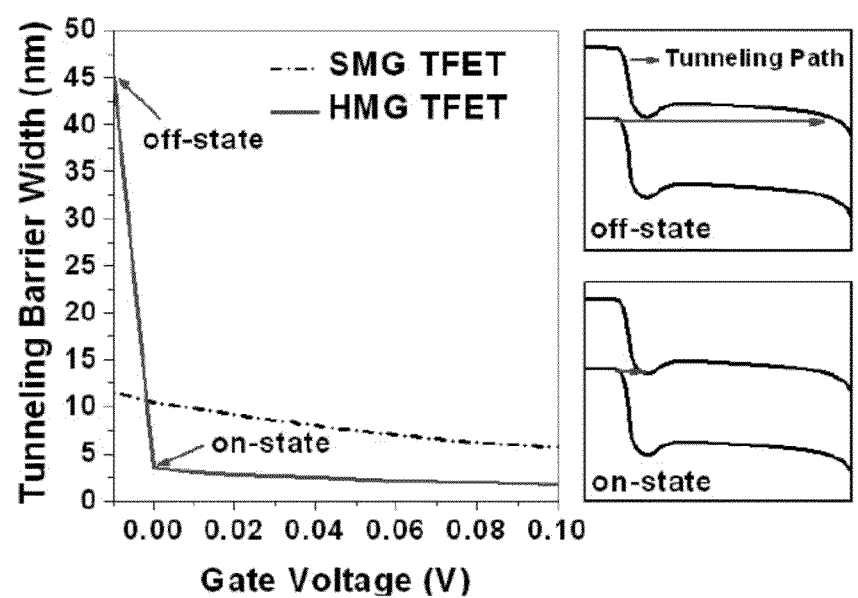

According to the present disclosure, the lateral potential profile of the TFET device is adjusted by the gate electrode material with the hetero-material work function. For N-type TFETs, the gate electrode material with a low hetero-material work function is adopted adjacent to the source region, such as Al or N-type doped polycrystalline silicon; while the gate electrode material with a high hetero-material work function is adopted adjacent to the drain region, such as Cu, Pt or P-type doped polycrystalline silicon, so as to form the hetero-material gate work function TFET (HMG TFET). FIGS. 17-19 are schematic diagrams showing simulation results of the TFET according to embodiments of the present disclosure. The HMG TFET corresponds to the embodiment of the present disclosure and the SMG TFET (single gate material TFET) corresponds to the prior art. The TFET adopts the 30 nm silicon on the insulator (SOI) as the substrate, which has a channel length of 50 nm. A gate dielectric layer is of $HfO_2$, whose equivalent oxide thickness (EOT) is 0.65 nm. The source region has boron doping at the concentration of $10^{20}$ $cm^{-3}$. The drain region has phosphorus doping at the concentration of $10^{19}$ $cm^{-3}$. The channel region has phosphorus doping at the concentration of $10^{16}$ $cm^{-3}$. During the simulation, a non-local tunneling model is adopted and the distribution of the carriers is considered. The model parameters are calibrated with the experimental data obtained from the reported literatures, which greatly improve the accuracy of the simulation.

FIG. 17 is a schematic diagram showing an energy band of the TFET with a hetero-metal-material gate work function obtained by a simulation according to an embodiment of the present disclosure. Since a special hetero-material gate structure is used, the energy band adjacent the source region is put upward and the energy band adjacent the drain region is put downward, so that a minimum value is formed. FIG. 18 is a schematic diagram showing a transfer characteristic of the TFET with a hetero-metal-material gate work function obtained by a simulation according to an embodiment of the present disclosure. Since the channel region is controlled by two gates simultaneously, the off-state changes according to the second gate (adjacent the drain region) and the on-state changes according to the first gate (adjacent the source region). As shown in FIG. 18, the HMG TFET has both properties of low off-state current and high on-state current and the sub-threshold slope decreases greatly, which can be explained by FIG. 19. As shown in FIG. 19, when the TFET is in the off-state, the tunneling path increases. With the increase of the gate voltage, once the conduction band minimum in the channel is below the valence band in a source region, the TFET device turns to be in the on-state. In this situation, the tunneling path decreases rapidly, which causes the tunneling current increases significantly, so the sub-threshold slope decreases significantly.

The embodiments of the present disclosure have the following advantages.

1. Since the TFET has the lateral hetero-material work function, the energy band profile in the channel region may be modulated, which not only significantly reduces the sub-threshold slope of the transistor by using an energy band engineering technique, but also greatly increases a drive current.

2. The first gate electrode or the second gate electrode may be of various metals or alloys, doped polycrystalline silicon or doped polycrystalline silicon germanium, so that the lateral hetero-material work function may be precisely adjusted by controlling parameters such as ratio of the alloy, type and concentration of doped impurities and germanium mole fraction. The fabrication techniques of the gate electrodes described above have a wide process window, and are easy to be implemented.

Although explanatory embodiments have been shown and described, it would be appreciated by those skilled in the art that changes, alternatives, and modifications all falling into the scope of the claims and their equivalents may be made in the embodiments without departing from the spirit and principles of the disclosure.

What is claimed is:
1. A tunneling field effect transistor, comprising:
a substrate;
a channel region formed in the substrate;
a source region and a drain region formed on two sides of the channel region, wherein the drain region is of a first doping type and the source region is of a second doping type, and the first doping type and the second doping type are opposite;
a gate stack formed on the channel region, wherein the gate stack comprises:
a gate dielectric layer, and
at least a first gate electrode and a second gate electrode distributed in a direction from the source region to the drain region and directly formed on the gate dielectric layer, wherein the second gate electrode comprises reactive ions to adjust a work function thereof so that the first gate electrode and the second gate electrode have different work functions, the second gate electrode is a metal electrode, and the reactive ions are selected from the group consisting of Er, Y, Pt, N, O, Cl, F, and combinations thereof; and a first side wall and a second side wall formed on a side of the first gate electrode and on a side of the second gate electrode respectively.

2. The tunneling field effect transistor according to claim 1, wherein the channel region is of the first doping type, the second doping type or is intrinsic and the channel region connects the source region and the drain region.

3. The tunneling field effect transistor according to claim 1, wherein the tunneling field effect transistor is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

4. The tunneling field effect transistor according to claim 1, wherein the tunneling device is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

5. A method for forming a tunneling field effect transistor, comprising steps of:
providing a substrate;
forming a gate dielectric material layer on the substrate;
forming a first gate electrode and a second gate electrode directly on the gate dielectric material layer, and introducing reactive ions in the second gate electrode to adjust a work function thereof so that the first gate electrode and the second gate electrode have different work functions, wherein the second gate electrode is a metal electrode, and the reactive ions are selected from the group consisting of Er, Y, Pt, N, O, Cl, F, and combinations thereof;
forming a first side wall and a second side wall on the gate dielectric material layer, and on a side of the first gate electrode and on a side of the second gate electrode;
implanting respectively a first doping impurity and a second doping impurity into the substrate to form a source region and a drain region, and defining an area between the source region and the drain region as a channel region, wherein the drain region is of a first doping type and the source region is of a second doping type and the first doping type and the second doping type are opposite; and
removing all the gate dielectric material layer except that under the first side wall, the second side wall, the first gate electrode and the second gate electrode, to form a gate dielectric layer.

6. The method according to claim 5, wherein the channel region is of the first doping type, the second doping type or is intrinsic and the channel region connects the source region and the drain region.

7. The method according to claim 5, wherein the tunneling field effect transistor is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

8. The method according to claim 5, wherein the tunneling field effect transistor is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

9. The method according to claim 5, further comprising:
forming a first contact layer and a second contact layer in the source region and the drain region respectively; and
forming the first interlayer dielectric layer and the second interlayer dielectric layer on the first contact layer and the second contact layer respectively.

10. The method according to claim 5, wherein forming the first gate electrode and the second gate electrode on the gate dielectric material layer further comprises:
forming the second gate electrode on the gate dielectric material layer;
conformally depositing a first gate electrode material layer on the second gate electrode and on part of the gate dielectric material layer;
etching anisotropically the first gate electrode material layer to form two first gate electrodes, each on a side of the second gate electrode; and
removing one of the two first gate electrodes.

11. The method according to claim 5, wherein forming the first gate electrode and the second gate electrode on the gate dielectric material layer further comprises:
forming the second gate electrode on the gate dielectric material layer;
forming a mask layer on a first part of the second gate electrode and a first part of the gate dielectric material layer;
conformally depositing a first gate electrode material layer on a second part of the second gate electrode, on a second part of the gate dielectric material layer and on the mask layer;
etching anisotropically the first gate electrode material layer to form the first gate electrode on a side of the second gate electrode; and
removing the mask layer and all the first gate electrode material layer except the first gate electrode.

12. The method according to claim 5, wherein the reactive ions are provided by ion implantation, plasma treatment or annealing.

13. A tunneling field effect transistor structure, comprising:
a n-type TFET with a hetero-material gate work function; and
a p-type TFET with a hetero-material gate work function, wherein each of the n-type TFET and the p-type TFET comprises:
a substrate;
a channel region formed in the substrate;
a source region and a drain region formed on two sides of the channel region, wherein the drain region is of a first doping type and the source region is of a second doping type, and the first doping type and the second doping type are opposite;
a gate stack formed on the channel region, wherein the gate stack comprises:
a gate dielectric layer, and
at least a first gate electrode and a second gate electrode distributed in a direction from the source region to the drain region and directly formed on the gate dielectric layer, wherein the second gate electrode comprises reactive ions to adjust a work function thereof so that the first gate electrode and the second gate electrode have different work functions, the second gate electrode is a metal electrode, and the reactive ions are selected from the group consisting of Er, Y, Pt, N, O, Cl, F, and combinations thereof; and a first side wall and a second side wall formed on a side of the first gate electrode and on a side of the second gate electrode respectively.

* * * * *